(12) United States Patent
Fujisawa et al.

(10) Patent No.: US 8,846,799 B2
(45) Date of Patent: Sep. 30, 2014

(54) EPOXY RESIN COMPOSITION, PREPREG, AND METAL-CLAD LAMINATE AND MULTILAYERED PRINTED WIRING BOARD

(75) Inventors: Hiroyuki Fujisawa, Koriyama (JP); Hiroki Tamiya, Koriyama (JP)

(73) Assignee: Panasonic Corporation, Kadoma-shi (JP)

( * ) Notice: Subject to any disclaimer, the term of this patent is extended or adjusted under 35 U.S.C. 154(b) by 634 days.

(21) Appl. No.: 12/735,235

(22) PCT Filed: Jul. 29, 2008

(86) PCT No.: PCT/JP2008/063576
§ 371 (c)(1),
(2), (4) Date: Jun. 24, 2010

(87) PCT Pub. No.: WO2009/081610
PCT Pub. Date: Jul. 2, 2009

(65) Prior Publication Data
US 2010/0294548 A1   Nov. 25, 2010

(30) Foreign Application Priority Data
Dec. 25, 2007   (JP) ................. 2007-332819

(51) Int. Cl.
| | | |
|---|---|---|
| *H05K 1/00* | (2006.01) | |
| *H05K 1/03* | (2006.01) | |
| *C08G 59/38* | (2006.01) | |
| *B32B 27/38* | (2006.01) | |
| *C08J 5/24* | (2006.01) | |
| *C08L 63/00* | (2006.01) | |
| *B32B 27/04* | (2006.01) | |
| *C08G 59/62* | (2006.01) | |
| *B32B 15/08* | (2006.01) | |
| *B32B 27/12* | (2006.01) | |
| *C08K 5/13* | (2006.01) | |
| *H05K 3/46* | (2006.01) | |
| *C08K 3/36* | (2006.01) | |
| *C08K 3/22* | (2006.01) | |

(52) U.S. Cl.
CPC ............. *H05K 1/0373* (2013.01); *C08K 5/13* (2013.01); *H05K 2201/0209* (2013.01); *H05K 2201/0239* (2013.01); *C08G 59/38* (2013.01); *B32B 27/38* (2013.01); *H05K 3/4626* (2013.01); *C08J 5/24* (2013.01); *C08K 3/36* (2013.01); *C08L 63/00* (2013.01); *B32B 27/04* (2013.01); *C08G 59/621* (2013.01); *B32B 15/08* (2013.01); *C08J 2363/08* (2013.01); *B32B 27/12* (2013.01); *C08K 3/22* (2013.01)
USPC ........................................... 524/493

(58) Field of Classification Search
CPC ........ B32B 15/08; B32B 27/04; B32B 27/38; C08G 59/38; C08G 59/621; C08J 5/24; C08L 63/00
USPC ........... 174/258; 428/413, 418; 523/402, 404, 523/414, 420, 457, 435, 436; 524/492, 493, 524/427; 525/525; 528/106, 108
See application file for complete search history.

(56) References Cited

U.S. PATENT DOCUMENTS

| | | | |
|---|---|---|---|
| 5,015,671 A  * | 5/1991 | Ono et al. ..................... 523/402 |
| 6,207,789 B1 | 3/2001 | Sue et al. | |
| 6,645,630 B1 | 11/2003 | Nakamura et al. | |
| 8,062,750 B2 * | 11/2011 | Motobe et al. ............... 428/413 |
| 2009/0008127 A1 | 1/2009 | Motobe et al. | |

FOREIGN PATENT DOCUMENTS

| | | |
|---|---|---|
| EP | 1 103 575 A1 | 5/2001 |
| JP | 2002-037865 A | 2/2002 |
| JP | 2002-226557 A | 8/2002 |
| JP | 2003-055537 A | 2/2003 |
| JP | 2005-002227 A | 1/2005 |
| JP | 2005-336426 A | 12/2005 |
| JP | 2006-124434 A | 5/2006 |
| JP | 2007-002053 A | 1/2007 |
| JP | 2007-051267 A | 3/2007 |
| WO | WO-2006/059363 A1 | 6/2006 |

OTHER PUBLICATIONS

Office Action dated Feb. 29, 2012, issued for the counterpart Taiwanese patent application.
Supplementary European Search Report for European Patent Application No. 08791811.6 issued Dec. 27, 2010.
International Search Report dated Sep. 9, 2008, issued on PCT/JP2008/063576.

* cited by examiner

*Primary Examiner* — Bijan Ahvazi
*Assistant Examiner* — Lanee Reuther
(74) *Attorney, Agent, or Firm* — Edwards Wildman Palmer LLP; James E. Armstrong, IV, Esq.; Nicholas J. DiCeglie, Jr.

(57) ABSTRACT

The present invention provides an epoxy resin composition exhibiting good workability in drilling, molding, and desmearing as well as good interlayer adhesion strength. This epoxy resin composition comprises an epoxy resin, a curing agent, and an inorganic filler. The epoxy resin is composed of a dicyclopentadiene-based epoxy resin and a novolac-based epoxy resin. The curing agent is a biphenyl-based phenol resin. The inorganic filler is composed of aluminum hydroxide and granular silica having an epoxy-silane treated surface. The epoxy resin composition contains 20 to 50% by weight of the granular silica. The epoxy resin composition contains 2 to 15% by weight, based on total weight of granular silica, of the aluminum hydroxide.

11 Claims, No Drawings

EPOXY RESIN COMPOSITION, PREPREG, AND METAL-CLAD LAMINATE AND MULTILAYERED PRINTED WIRING BOARD

TECHNICAL FIELD

This invention relates to epoxy resin composition which is employed as a material of printed circuit board, prepreg, metal-clad laminate. This invention also related to method of fabricating a multilayered printed wiring board with these materials.

BACKGROUND ART

Various materials of printed wiring boards have been proposed so far. (e.g., patent references 1 to 6) Epoxy resin composition is required to exhibit heat-resistance for utilized as a printed wiring board, in view of recent trend in Pb-free soldering. Various epoxy resin composition have been developed to meet the requirement, such as dicyclopentadine-based epoxy resin, novolac-based epoxy resin, biphenyl-based phenol resin.

Reference 1: Japanese unexamined patent publication 2007-2053
Reference 2: Japanese unexamined patent publication 2005-336426
Reference 3: Japanese unexamined patent publication 2002-37865
Reference 4: Japanese unexamined patent publication 2002-226557
Reference 5: Japanese unexamined patent publication 2003-55537
Reference 6: Japanese unexamined patent publication 2006-124434

DISCLOSURE OF THE INVENTION

Technical Problem

However, conventional epoxy resin compositions easily wears drills in process of drilling for fabrication of printed circuit board, due to its low drilling workability. In process of desmearing conventional epoxy resin compositions, it is difficult to sufficiently remove smears generated in the drilling process because of low solubility of smears. Besides, the conventional epoxy resin compositions exhibits a low moldability, and suffers from voids therein due to difficulty in completely filling IVH (inner via-hole) with the epoxy resin composition in superimposing process. As a result, prepregs and metal-clad laminates made of such epoxy resin compositions exhibit low interlayer adhesion strength.

The present invention is intended to overcome the above problem, and has an object to provide an epoxy resin composition, a prepreg, a metal-clad laminate, and a multilayered printed wiring board which respectively exhibit good workability in drilling, molding, and desmearing as well as good interlayer adhesion strength.

Solution to Problem

An epoxy resin composition recited in claim 1 comprises an epoxy resin, a curing agent, and an inorganic filler. The epoxy resin is composed of a dicyclopentadiene-based epoxy resin and a novolac-based epoxy resin. The curing agent is a biphenyl-based phenol resin. The inorganic filler is composed of aluminum hydroxide and granular silica having an epoxy-silane treated surface. The epoxy resin composition contains 20 to 50% by weight of said granular silica. The epoxy resin composition contains 2 to 15% by weight, based on total weight of granular silica, of said aluminum hydroxide.

A prepreg recited in claim 2 comprises a substrate impregnated with the epoxy resin composition as defined in claim 1. The epoxy resin composition is heated and dried to a semi-cured state.

A metal-clad laminate recited in claim 3 comprises the prepreg of claim 2 and a metal foil. The metal foil is superimposed at least one of opposite surfaces of the prepreg and heat-pressed thereon.

A multilayered printed wiring board recited in claim 4 comprises the metal-clad laminate of claim 3. The metal-clad laminate is formed with a conductor pattern for use as a core member.

Advantageous Effects of Invention

An epoxy resin composition in claim 1 enables to prepare a prepreg, a metal-clad laminate, and a multilayered printed wiring board, each of which exhibits good workability in drilling, molding, and desmearing as well as good interlayer adhesion strength.

The prepreg in claim 2 exhibits good workability in drilling, molding, and desmearing as well as good interlayer adhesion strength.

The metal-clad laminate in claim 3 exhibits good workability in drilling, molding, and desmearing as well as good interlayer adhesion strength.

The multilayered printed wiring board in claim 4 exhibits good workability in drilling, molding, and desmearing as well as good interlayer adhesion strength.

BEST MODE FOR CARRYING OUT THE INVENTION

Hereafter, explanations are given as to an embodiment of the present invention.

An epoxy resin composition in the present invention contains an epoxy resin, a curing agent, and an inorganic filler.

The epoxy resin in the present invention is composed of a dicycopentadiene-based epoxy resin and a novolac-based epoxy resin. The epoxy resin in the present invention may contain an inflammable halogenated epoxy resin, or the like. Preferably, the epoxy resin composition in the present invention contains 25 to 80 percent by weight of the epoxy resin, and 20 to 100 percent by weight of dicyclopentadiene-based epoxy resin and novolac-based epoxy resin. Preferably, in the epoxy resin composition, the mass ratio of dicyclopentadiene-based epoxy resin to novolac-based epoxy resin is preferably set in the range of 3:1 to 1:3.

Biphenyl-based phenol resin curing agent is employed as the curing agent in the present invention. The epoxy resin composition is preferred to contain 15 to 60 percent by weight of the curing agent.

The inorganic filler in the present invention is composed of aluminum hydroxide and granular silica having an epoxy-silane treated surface. The granular silica having an epoxy-silane treated surface enables to improve the flowability of the epoxy resin composition. When containing fragmented silica instead of granular silica, the epoxy resin composition suffers from voids because IVH (inter via hole) are not completely filled with the composition due to its lowered flowability, leading to a lowered workability of molding. The granular silica having a epoxy-silane treated surface enables to improve interlayer adhesion strength. When the granular silica has no treated surface or an amino-silane treated surface, the epoxy resin composition suffers from lack of adhesion strength between the epoxy resin and the annular silica. The lack of adhesion strength in the epoxy resin composition is responsible for lack of interlayer adhesion, which causes peeling in heating.

The epoxy resin composition contains 20 to 50 percent by weight of the annular silica. When the epoxy resin composition contains less than 20 percent by weight of the annular silica, it is difficult to sufficiently desmear for lack of solubility of smear into desmear solution mainly containing alkali permanganate. When containing more than 50 percent by weight of the annular silica, the epoxy resin composition easily wears drills due to its drilling workability. This epoxy resin composition exhibits a poor moldability resulting from its low flowability, suffering from voids due to difficulty in completely filling IVH (inner via-hole) with the epoxy resin composition in superimposing process.

The epoxy resin composition contains 2 to 15 percent by weight, based on total weight of granular silica, of aluminum hydroxide. Aluminum hydroxide exhibits a hardness smaller than that of annular silica. When containing less than 2 percent by weight of aluminum hydroxide, the epoxy resin composition easily wears the drill, exhibiting a poor drill workability. Aluminum hydroxide generally has fragmented form. When containing more than 15 percent by weight of aluminum hydroxide, the epoxy resin composition exhibits a low flowability and a poor molding workability due to difficulty in completely filling the IVH in process of superimposing.

The epoxy resin composition can be dissolved into a solvent, such as methylethylketone, together with epoxy resin, curing agent, and inorganic filler, for preparation of a resin varnish.

Next, the epoxy resin composition prepared as the resin varnish can be employed to prepare a prepreg. In the preparation of prepreg, a glass-cloth substrate is impregnated with the epoxy resin composition. Next, the substrate is heated and dried to be semi-cured (B-stage state), for preparing the prepreg.

This prepreg can be employed to prepare a metal-clad laminate. First, metal foils such as Cu-foils are superimposed on at least one of opposite surfaces of the prepreg. Next, the resultant prepreg is heat-pressed to give the metal-clad laminate. The metal-clad laminate may be prepared from only one prepreg or superposition of plural prepregs.

The metal-clad laminate can be employed to prepare a multi-layered printed wiring board. The multi-layered printed wiring board is formed with a conductor pattern by subtractive method or the like, for use as a core member. From example, the core member is formed at its opposite surfaces with metal foils (e.g., Cu-foils), and molded by heat-pressing, for preparation of the multi-layered printed wiring board.

The prepreg, metal-clad laminate, and multi-layered printed wiring board can be prepared from the above epoxy resin composition, as described above. These prepreg, metal-clad laminate, and multi-layered printed wiring board exhibit good workability in drilling, molding, and desmearing as well as a good interlayer adhesion.

EXAMPLE

Hereafter, the present invention is specifically described with reference to Example.

Epoxy resin in this Example is composed of dicyclopentadiene-based epoxy resin (available from DIC Corporation as "HP-7200", epoxy equivalents 280) and novolac-based epoxy resin (available from DIC Corporation as "N-690", epoxy equivalents 225), and inflammable halogenated epoxy resin (available from DIC Corporation as "epiclon 153", epoxy equivalents 400, bromine content 48.0 percent by weight).

Curing agent in this Example is composed of biphenyl-based phenol resin curing agent (available from Meiwa plastic industries, Ltd. as "MEH-7851").

Inorganic filler in this Example contains annular silica having a epoxy-silane treated surface, aluminum hydroxide. This annular silica is available from Admatechs as "SC2500-SEJ". The aluminum hydroxide is available from "Sumitomo Chemical Co. Ltd. as "CL303". The organic filler in this Example may contain fragmented silica (available from Tatsumori Co. Ltd. as "FUSELEX FLB-2"), annular silica having not-treated surface (available from Admatechs as "SO-25R"), annular silica having a amino-silane treated surface. This annular silica having a amino-silane treated surface can be prepared from treatment of the annular silica (available from Admatechs as "SO-25R") with aminosilane (3-aminopropyltrimethoxysilane, available from Shin-etsu Chemical Co., Ltd. as "KBM903").

Methylethylketone (MEK) was employed as a solvent.

<Preparation of Resin Varnish>

The resin varnish was prepared as follows. First, epoxy resin and curing agent in predetermined amounts in accordance with Table 1 were dissolved into methylethylketone. In preparation of the solution, the total amount of epoxy resin and the curing agent were controlled to account for 70 percent by total weight of the solution. Next, the solution was stirred for two hours by disper. Subsequently, the inorganic filler was dissolved in a predetermined amount in accordance with Table 1, into the resultant solution, for preparation of resin varnish.

<Preparation of Prepreg>

The glass cloth (available from Nitto Boseki Co., Ltd. as "2116 type-cloth") was employed as a substrate, and impregnated with the above resin varnish at ambient temperature. The resultant product was heated at about 170° C. for five minutes by means of non-contact type heat unit, such that solvent in the varnish was evaporated. The epoxy resin composition was semi-cured to give a prepreg. The content in the prepreg is controlled to account for 100 parts by weight, in relation to 100 parts by weight of glass cloth.

<Preparation of Prepreg>

First, two of the above prepregs were superimposed with each other. Next, two Cu-foils (available from Mitsui mining & swelting Co., Ltd. as "3EC-III", thickness: 35 μm) as metal foils are disposed on two prepregs, such that each of rough surfaces (mat surfaces) of the Cu foil faces to each prepreg, and two prepregs are superimposed between two Cu-foils. The resultant laminate was heat-pressed (170° C., 60 minutes, 2.94 MPa (30 kg/cm$^2$)) to be molded, so as to give a Cu-clad laminate.

<Evaluation 1: Drilling Workability>

First, three metal-clad laminates were superimposed with each other, and drilled with a drill bit (available from Union Tool Co. as "UV L0950", drill diameter: 0.3 mm) for being used to obtain a drill bit wear rate. This drill bit wear rate was evaluated as drilling workability. In this evaluation, the drill bit was set to rotate at a rotational speed of 160 krpm, a feed rate of 3.2 m/min, and 3000 hits.

<Evaluation 2: IVH Implantablity>

The Cu-clad laminate (available from Matsushita Electric Works Co., Ltd. as "R-1766", thickness of 0.8 mm, dimension of Cu-foil of 35 μm×35 μm) were drilled, and then Cu-coated to form a through-hole having a diameter of 0.3 mm. Next, the above prepreg was superimposed on the Cu-clad laminate, and molded by heat-pressing (170° C., 60 minutes, 2.94 MPa (30 kg/cm²)), such that the through-hole was filled with resin. IVH implantablity was evaluated through the observation of voids inside through-hole by using optical microscope.

<Evaluation 3: Desmear Property>

Cu-foils were removed from the above metal-clad laminate by etching. Next, the laminate was desmear-treated, in order to obtain the weight reduction (resulting from removal of smear) as desmear amount. The desmear treatment was conducted by desmear process of MacDermid Co. This desmear process includes a step of swelling by means of "macutizar 9204" (35° C., 7 minutes), a step of treating with "macutizar 9275" (75° C., 15 minutes), and a step of neutralizing by means of "macutizar 9279" (43° C., 5 minutes). Desmear property shows effectiveness in desmear treatment. High desmear amount exhibits good desmear property. Low desmear amount exhibits poor desmear property.

<Evaluation 4: Interlayer Adhesion Strength>

The interlayer adhesion strength was obtained as a peeling strength between glass-clothes of the above metal-clad laminate, in accordance with JIS-C6481.

In contrase, the epoxy resin composition in reference 1 contains fragmented silica, exhibiting lowered flowability and poor IVH implantablity.

The epoxy resin composition in reference 2 contains low amount of granular silica, exhibiting a poor desmear amount.

The epoxy resin composition in reference 3 contains excessively large amount of granular silica, exhibiting a large drill bit wear rate and a poor IVH implantability of the prepreg.

The epoxy resin composition in reference 4 contains low amount of aluminum hydroxide, exhibiting a large drill bit wear rate.

The epoxy resin composition in reference 5 contains excessively large of aluminum hydroxide, exhibiting a poor IVH implantablity of the prepreg.

In the epoxy resin compositions in references 6 and 7, the granular silica contains no epoxy-silane treated surface. These epoxy resin compositions suffers from low adhesion strength between the annular silica and epoxy resin, exhibiting poor interlayer adhesion strength.

TABLE 1

| | | | Ex. 1 | Ex. 2 | Ex. 3 | Ex. 4 | Com. 1 | Com. 2 | Com. 3 | Com. 4 | Com. 5 | Com. 6 | Com. 7 |
|---|---|---|---|---|---|---|---|---|---|---|---|---|---|
| Ingredients in Epoxy resin composition | Epoxy resin | HP-7200 | 9.3 | 9.3 | 9.3 | 9.3 | 9.3 | 9.3 | 9.3 | 9.3 | 9.3 | 9.3 | 9.3 |
| | | N-690 | 18.5 | 18.5 | 18.5 | 18.5 | 18.5 | 18.5 | 18.5 | 18.5 | 18.5 | 18.5 | 18.5 |
| | | Epiclon 153 | 27.8 | 27.8 | 27.8 | 27.8 | 27.8 | 27.8 | 27.8 | 27.8 | 27.8 | 27.8 | 27.8 |
| | Curing agent | MEH-7851 | 44.4 | 44.4 | 44.4 | 44.4 | 44.4 | 44.4 | 44.4 | 44.4 | 44.4 | 44.4 | 44.4 |
| | Inorganic filler | SC2500-SEJ | 26.6 | 26.6 | 96.1 | 96.1 | — | 22 | 108 | 26.6 | 26.6 | — | — |
| | | SO-25R (not treated) | — | — | — | — | — | — | — | — | — | 26.6 | — |
| | | SO-25R (treated with aminosilane) | — | — | — | — | — | — | — | — | — | — | 26.6 |
| | | FUSELEX FLB-2 | — | — | — | — | 26.6 | — | — | — | — | — | — |
| | | CL303 | 0.56 | 3.96 | 2 | 14.3 | 0.56 | 0.46 | 2.27 | 0.48 | 4.52 | 0.56 | 0.56 |
| Inorganic filler | Silica | shape | Granular | Granular | Granular | Granular | Fragmented | Granular | Granular | Granular | Granular | Granular | Granular |
| | | Content (in percent by weight based on the composition) | 21 | 21 | 49 | 46 | 21 | 18 | 52 | 21 | 21 | 21 | 21 |
| | | Surface treatment | Epoxy silane | Epoxy silane | Epoxy silane | Epoxy silane | Epoxy silane | Epoxy silane | Epoxy silane | Epoxy silane | Epoxy silane | Not treated | Amino silane |
| | Aluminum hydroxide | Content (in percent by weight based on the silica) | 2.1 | 14.9 | 2.1 | 14.9 | 2.1 | 2.1 | 2.1 | 1.8 | 17 | 2.1 | 2.1 |
| Evaluation | Drilling workability | Drill bit wear rate | 20 | 15 | 25 | 20 | 20 | 20 | 30 | 30 | 20 | 20 | 20 |
| | IVH implantablity | Voids | Not found | Not found | Not found | Not found | Found | Not found | Found | Not found | Found | Not found | Not found |
| | Desmear property | Desmear amount (mg/dm2) | 10 | 12 | 15 | 17 | 10 | 5 | 10 | 10 | 10 | 10 | 10 |
| | Interlayer adhesion strength | (kN/m) | 1.2 | 1.2 | 1.2 | 1.2 | 1.2 | 1.2 | 1.2 | 1.2 | 1.2 | 0.4 | 0.5 |

Table 1

As shown in Table 1, each of epoxy resin compositions in examples 1 to 4 contains an inorganic filler composed of aluminum hydroxide and annular silica having an epoxy-silane treated surface in predetermined amount, exhibiting a low drill bit wear rate, a sufficiently high desmear amount, and a sufficiently high interlayer adhesion strength. Each of prepregs in examples 1 to 4 exhibits good IVH implantability.

The invention claimed is:

1. An epoxy resin composition comprising an epoxy resin, a curing agent, and an inorganic filler,
   said epoxy resin being composed of a dicyclopentadiene-based epoxy resin and a novolac-based epoxy resin,
   said curing agent being a biphenyl-based phenol resin,
   said inorganic filler being composed of aluminum hydroxide and granular silica having an epoxy-silane treated surface, wherein the epoxy resin composition contains 20 to 50% by weight, based on the total weight of the epoxy resin composition, of said granular silica, and wherein the epoxy resin composition contains 2 to 15% by weight, based on total weight of said granular silica, of said aluminum hydroxide.

2. A prepreg comprising a substrate impregnated with said epoxy resin composition as defined in claim 1, wherein said epoxy resin composition being heated and dried to a semi-cured state.

3. A metal-clad laminate comprising the prepreg of claim 2, and a metal foil superimposed at least one of opposite surfaces of the prepreg and heat-pressed thereon.

4. A multilayered printed wiring board comprising the metal-clad laminate of claim 3, wherein said metal-clad laminate is formed with a conductor pattern for use as a core member.

5. The epoxy resin composition of claim 1, wherein the epoxy resin further contains an inflammable halogenated epoxy resin.

6. The epoxy resin composition of claim 1, wherein the mass ratio of dicyclopentadiene-based epoxy resin to novolac-based epoxy resin is from 3:1 to 1:3.

7. The epoxy resin composition of claim 1, wherein the epoxy resin composition contains 15 to 60% by weight, based on total weight of the composition, of said curing agent.

8. The epoxy resin composition of claim 1, wherein the epoxy resin composition contains 46% by weight, based on the total weight of the composition, of said granular silica, and wherein the epoxy resin composition contains 14.9% by weight, based on total weight of said granular silica, of said aluminum hydroxide.

9. The epoxy resin composition of claim 1, wherein the epoxy resin composition contains 49% by weight, based on the total weight of the composition, of said granular silica, and wherein the epoxy resin composition contains 2.1% by weight, based on total weight of said granular silica, of said aluminum hydroxide.

10. The epoxy resin composition of claim 1, wherein the epoxy resin composition contains 21% by weight, based on the total weight of the composition, of said granular silica, and wherein the epoxy resin composition contains 14.9% by weight, based on total weight of said granular silica, of said aluminum hydroxide.

11. The epoxy resin composition of claim 1, wherein the epoxy resin composition contains 21% by weight, based on the total weight of the composition, of said granular silica, and wherein the epoxy resin composition contains 2.1% by weight, based on total weight of said granular silica, of said aluminum hydroxide.

* * * * *